US006344755B1

(12) United States Patent
Reddy et al.

(10) Patent No.: US 6,344,755 B1
(45) Date of Patent: *Feb. 5, 2002

(54) PROGRAMMABLE LOGIC DEVICE WITH REDUNDANT CIRCUITRY

(75) Inventors: Srinivas T. Reddy, Fremont; Manuel Mejia, San Jose; Andy L. Lee, San Jose; Bruce B. Pedersen, San Jose, all of CA (US)

(73) Assignee: Altera Corporation, San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/691,424

(22) Filed: Oct. 18, 2000

Related U.S. Application Data

(63) Continuation of application No. 09/295,672, filed on Apr. 20, 1999.
(60) Provisional application No. 60/092,778, filed on Jul. 14, 1998.

(51) Int. Cl.[7] ............................................. H03K 19/003
(52) U.S. Cl. .............................. 326/10; 326/38; 326/39
(58) Field of Search .............................. 326/10, 38, 39, 326/41

(56) References Cited

U.S. PATENT DOCUMENTS

| 3,566,153 A | 2/1971 | Spencer, Jr. et al. ......... 307/205 |
| 3,805,039 A | 4/1974 | Stiffler .................. 235/153 AE |
| 3,995,261 A | 11/1976 | Goldberg .............. 340/173 BB |
| 4,020,469 A | 4/1977 | Manning .................. 340/172.5 |
| 4,051,354 A | 9/1977 | Choate ........................ 235/312 |
| 4,124,899 A | 11/1978 | Birkner et al. ............... 364/716 |
| 4,380,811 A | 4/1983 | Götze et al. .................... 371/10 |
| 4,538,247 A | 8/1985 | Venkateswaran ............ 365/230 |
| 4,551,814 A | 11/1985 | Moore et al. ................ 364/716 |
| 4,566,102 A | 1/1986 | Hefner ......................... 371/11 |
| 4,609,986 A | 9/1986 | Hartmann et al. .......... 364/200 |
| 4,617,479 A | 10/1986 | Hartmann et al. .......... 307/465 |

(List continued on next page.)

FOREIGN PATENT DOCUMENTS

| EP | 351983 A3 | 1/1990 | ........... G06F/11/20 |
| EP | 361404 A3 | 4/1990 | ........... G06F/11/20 |
| EP | 437081 A2 | 7/1991 | ........... G06F/11/20 |
| EP | 596453 A2 | 5/1994 | ........... G06F/11/20 |

OTHER PUBLICATIONS

"A Survey of Microcelluar Research", R.C. Minnick, Journal of the Association of Computing Machinery, vol. 14, No. 2, pp. 203–241, Apr. 1967.

(List continued on next page.)

Primary Examiner—Michael Tokar
Assistant Examiner—A. Tran
(74) Attorney, Agent, or Firm—Fish & Neave; Robert R. Jackson; Pejman Sharifi

(57) ABSTRACT

A programmable logic device is provided that allows a redundant row of programmable logic to be shifted into place to repair the device when a defect is detected in a row of programmable logic on the device. The redundant row is shifted into place by routing programming data into the normal logic and the redundant logic while bypassing the row of logic containing the defect. Switching circuitry may be used to direct programming data into the serial inputs of various data registers that are then used to load the programming data into the device. The patterns of programmable connections that are made between programmable logic regions on the device and vertical and horizontal conductors also allow redundant logic to be shifted into place. Some connections between the logic and the horizontal and vertical conductors may be identical within a column to facilitate shifting. Other connections may only partially overlap between respective rows. The partially overlapping pattern allows the connections to be less regular, which increases flexibility when routing signals on the device.

15 Claims, 15 Drawing Sheets

U.S. PATENT DOCUMENTS

| | | | |
|---|---|---|---|
| 4,641,285 A | 2/1987 | Sasaki et al. | 365/210 |
| 4,677,318 A | 6/1987 | Veenstra | 307/465 |
| 4,691,301 A | 9/1987 | Anderson | 365/200 |
| 4,700,187 A | 10/1987 | Furtek | 340/825.83 |
| 4,703,206 A | 10/1987 | Cavlan | 307/465 |
| 4,706,216 A | 11/1987 | Carter | 365/94 |
| 4,713,792 A | 12/1987 | Hartmann et al. | 364/900 |
| 4,722,084 A | 1/1988 | Morton | 371/9 |
| 4,774,421 A | 9/1988 | Hartmann et al. | 307/465 |
| 4,791,319 A | 12/1988 | Tagami et al. | 307/441 |
| 4,798,976 A | 1/1989 | Curtin et al. | 307/441 |
| 4,800,302 A | 1/1989 | Marum | 307/441 |
| 4,829,198 A | 5/1989 | Maley et al. | 307/441 |
| 4,871,930 A | 10/1989 | Wong et al. | 307/465 |
| 4,899,067 A | 2/1990 | So et al. | 307/465 |
| 4,912,342 A | 3/1990 | Wong et al. | 307/465 |
| 4,920,497 A | 4/1990 | Upadhyaya et al. | 364/491 |
| 4,928,022 A | 5/1990 | Marum | 307/241 |
| RE33,521 E | 1/1991 | Mori et al. | 364/200 |
| 5,019,736 A | 5/1991 | Furtek | 307/465 |
| 5,045,720 A | 9/1991 | Bae | 307/441 |
| 5,121,006 A | 6/1992 | Pedersen | 307/465 |
| 5,163,023 A | 11/1992 | Ferris et al. | 365/200 |
| 5,187,393 A | 2/1993 | El Gamal et al. | 307/465.1 |
| 5,204,836 A | 4/1993 | Reed | 365/200 |
| 5,220,214 A | 6/1993 | Pedersen | 307/465 |
| 5,237,219 A | 8/1993 | Cliff | 307/465 |
| 5,255,227 A | 10/1993 | Haeffele | 365/200 |
| 5,255,228 A | 10/1993 | Hatta et al. | 365/200 |
| 5,260,610 A | 11/1993 | Pedersen et al. | 307/465 |
| 5,260,611 A | 11/1993 | Cliff et al. | 307/465 |
| 5,325,334 A | 6/1994 | Roh et al. | 365/201 |
| 5,369,314 A | 11/1994 | Patel et al. | 326/13 |
| 5,426,379 A | 6/1995 | Trimberger | 326/39 |
| 5,434,514 A | 7/1995 | Cliff et al. | 326/12 |
| 5,459,342 A | 10/1995 | Nogami et al. | 257/209 |
| 5,471,427 A | 11/1995 | Murakami et al. | 365/200 |
| 5,483,178 A | 1/1996 | Costello et al. | 326/41 |
| 5,485,102 A * | 1/1996 | Cliff et al. | 326/10 |
| 5,498,975 A | 3/1996 | Cliff et al. | 326/10 |
| 5,508,636 A | 4/1996 | Mange et al. | 326/38 |
| 5,592,102 A | 1/1997 | Lane et al. | 326/10 |
| 5,670,895 A | 9/1997 | Kazarian et al. | 326/39 |
| 5,821,772 A * | 10/1998 | Ong et al. | 326/38 |
| 5,825,197 A | 10/1998 | Lane et al. | 326/10 |
| 5,861,761 A * | 1/1999 | Kean | 326/41 |
| 6,201,404 B1 * | 3/2001 | Reddy et al. | 326/10 |

OTHER PUBLICATIONS

"Programmable Logic Arrays—Cheaper by the Millions," S.E. Wahlstrom, Electronics, Dec. 1967, pp. 90–95.

"Recents Developments in Switching Theory", A. Mukhopadhyay, ed., Academic Press, New York, 1971, chapters VI and XI, pp. 229–254 and 369–422.

"Redundancy Techniques for Fast Static RAMs", K. Kokkonen et al., Digest of Technical Papers, IEEE International Solid–State Circuits Conference, pp. 80–81, Feb., 1981.

"Cost–Effective Yield Improvement in Fault–Tolerant VLSI Memory", J. Bindels et al., Digest of Technical Papers, IEEE International Solid–State Circuits Conference, pp. 82–83, Feb., 1981.

"A 100ns 64K Dynamic RAM using Redundancy Techniques", S. Eaton et al., Digest of Technical Papers, IEEE International Solid–State Circuits Conference, pp. 84–85, Feb., 1981.

"Introducing Redundancy In Field Programmable Gate Arrays", F. Hatori et al., Proceedings of the IEEE 1993 Custom Integrated Circuits Conference, pp. 7.1.1–7.1.4, May 1993.

"On the Design of a Redundant Programmable Logic Array (RPLA)", C.–L. Wey et al., IEEE Journal of Solid State Circuits, vol. SC–22, No. 1, Feb. 1987, pp. 114–117.

Preliminary Data booklet for Altera 32 Macrocell High Density Max EPLD EPM5032, 1988, Altera Corporation.

"Programmable Logic Devices with Spare Circuits for Use in Replacing Defective Circuits", Altera Corporation.

"Laser Correcting Defects to Create Transparent Routing for Larger Area FPGA's", G.H. Chapman and B. Dufort, FPGA '97—ACM/SIGDA International Symposium on Field Programmable Gate Arrays, 1997, pp. 17–23.

* cited by examiner

DRIVER PATTERN FOR A DRIVER WHICH IS IN THE SAME LOCATION IN EACH PROGRAMMABLE LOGIC REGION IN A COLUMN OF PROGRAMMABLE LOGIC REGIONS

| | DRIVER DRIVES THE FOLLOWING V LINES | | | |
|---|---|---|---|---|
| ROW 0 | (84) | 43 | 22 | 1 |
| ROW 1 | 74 | (43) | 22 | 1 |
| ROW 2 | 74 | 53 | (22) | 1 |
| ROW 3 | 74 | 53 | 32 | (1) |
| ROW 4 | (74) | 53 | 32 | 11 |
| ROW 5 | 64 | (53) | 32 | 11 |
| ROW 6 | 64 | 43 | (32) | 11 |
| ROW 7 | 64 | 43 | 22 | (11) |
| ROW 8 | (64) | 43 | 22 | 1 |
| ROW 9 | 74 | (43) | 22 | 1 |
| ROW 10 | 74 | 53 | (22) | 1 |
| ROW 11 | 74 | 53 | 32 | (1) |
| ROW 12 | (74) | 53 | 32 | 11 |
| ROW SP | (74) | 53 | 32 | 11 |

THE NUMBERS THAT ARE CIRCLED INDICATE REDUNDANT CONNECTIONS.

FIG .11

PROGRAMMABLE LOGIC DEVICE WITH REDUNDANT CIRCUITRY

This application is a continuation of U.S. patent application Ser. No. 09/295,672 filed Apr. 20, 1999, hereby incorporated by reference herein in its entirety, which claims the benefit of United States provisional application Ser. No. 60/092,778, filed Jul. 14, 1998.

BACKGROUND OF THE INVENTION

This invention relates to programmable logic devices. More particularly, this invention relates to redundant circuitry for programmable logic devices.

Programmable logic devices are integrated circuits that may be programmed by a user to perform various logic functions. Like all integrated circuits, programmable logic devices are susceptible to manufacturing defects. If the rate of defects in a production run is high, the yield of good parts will be low, thereby increasing the manufacturing cost of each good part. In order to increase yields, programmable logic devices may be provided with spare or redundant circuits. When a manufacturing defect is detected in a circuit on the programmable logic device, that defective circuit may be repaired by switching the redundant circuit into use in its place. Programmable logic devices that are repaired in this way operate identically to devices that were manufactured completely without defects. The user therefore need not be concerned with whether a device has been repaired or was manufactured without a defect.

Care must be taken, however, that the overhead in circuit resources that is required to implement a redundancy scheme on a programmable logic device does not unduly increase the cost of manufacturing the programmable logic device. If too many resources are used to implement redundancy, the benefits of redundancy may be lost.

In addition, it is important that the patterns of interconnection conductors used to route signals on the programmable logic device are arranged so that they can accommodate redundancy.

The programmable logic on a programmable logic device may be organized by grouping logic in regions of various sizes. For example, programmable logic devices may contain relatively small areas of logic referred to as logic elements. These logic elements may be grouped to form programmable logic regions. The programmable logic regions and associated programmable memory regions may be grouped to form programmable logic super-regions. Appropriate switching resources and interconnections must be provided to implement redundancy in programmable logic devices that contain programmable logic that is organized in this way.

It is therefore an object of the present invention to provide a redundancy scheme in which the circuitry used to switch redundant circuitry into use and the interconnection patterns used to implement redundancy may be simplified and improved.

SUMMARY OF THE INVENTION

These and other objects of the invention are accomplished in accordance with the principles of the present invention by providing a programmable logic device in which redundant circuitry may be shifted into place to repair defective circuitry. The programmable logic device has rows and columns of programmable logic regions. One of the rows of programmable logic regions may be a redundant logic region. When a defect is detected in a row of the device, programming data that would otherwise have been loaded into that row is routed into normal rows without defects and the redundant row.

The programming data is shifted into the device using switching circuitry. Two data registers are associated with each row. One of the data registers in each row is loaded serially. The other data register in each row is loaded in parallel. In normal operation, switching circuitry connects the serially-loaded data registers in a chain, so that data may be loaded into the chain from a data input pin. After the data has been loaded in this way, the data is shifted into the other data registers in parallel. When a defect is detected in one of the rows, the switching circuitry is reconfigured using fuse logic. The manufacturer may configure the fuse logic using a laser. The fuse logic directs the switching circuitry to bypass the serial data register in the defective row. Programming data is instead loaded into the serial data registers in the good rows and in the redundant row.

Test registers may be provided to facilitate the unloading of test data from the device. Switching circuitry associated with test registers may be used to serially unload the test data through a single pin.

Each programmable logic region has input and output lines connected to horizontal and vertical conductors on the device by programmable connectors. The lines are connected to the conductors by patterns of programmable connectors that accommodate row shifting. For example, in each column, the patterns of the input lines from the horizontal and vertical conductors and the patterns of the output lines to the horizontal conductors may be the same for the programmable logic regions in each row.

The programmable connectors between the output lines and the vertical conductors may include normal programmable connectors and redundant programmable connectors. This allows the vertical output pattern of programmable connectors to vary from row to row, thereby increasing routing flexibility. The normal and redundant programmable connectors are programmed with programming data. When there is no row shifting the programming data configures particular normal programmable connectors associated with lines in unshifted rows to form electrical connections to the vertical conductors and the programming data inactivates the redundant programmable connectors. When there is row shifting, the programming data configures the redundant programmable connectors and some of the normal programmable connectors in each shifted row to make the electrical connections that would otherwise have been made by just the normal programmable connectors in the corresponding unshifted row.

Further features of the invention and its nature and various advantages will be more apparent from the accompanying drawings and the following detailed description of the preferred embodiments.

BRIEF DESCRIPTION OF THE DRAWINGS

FIG. 11 is a table showing more details of the pattern shown in FIG. 10.

DETAILED DESCRIPTION OF THE PREFERRED EMBODIMENTS

Figure 1:
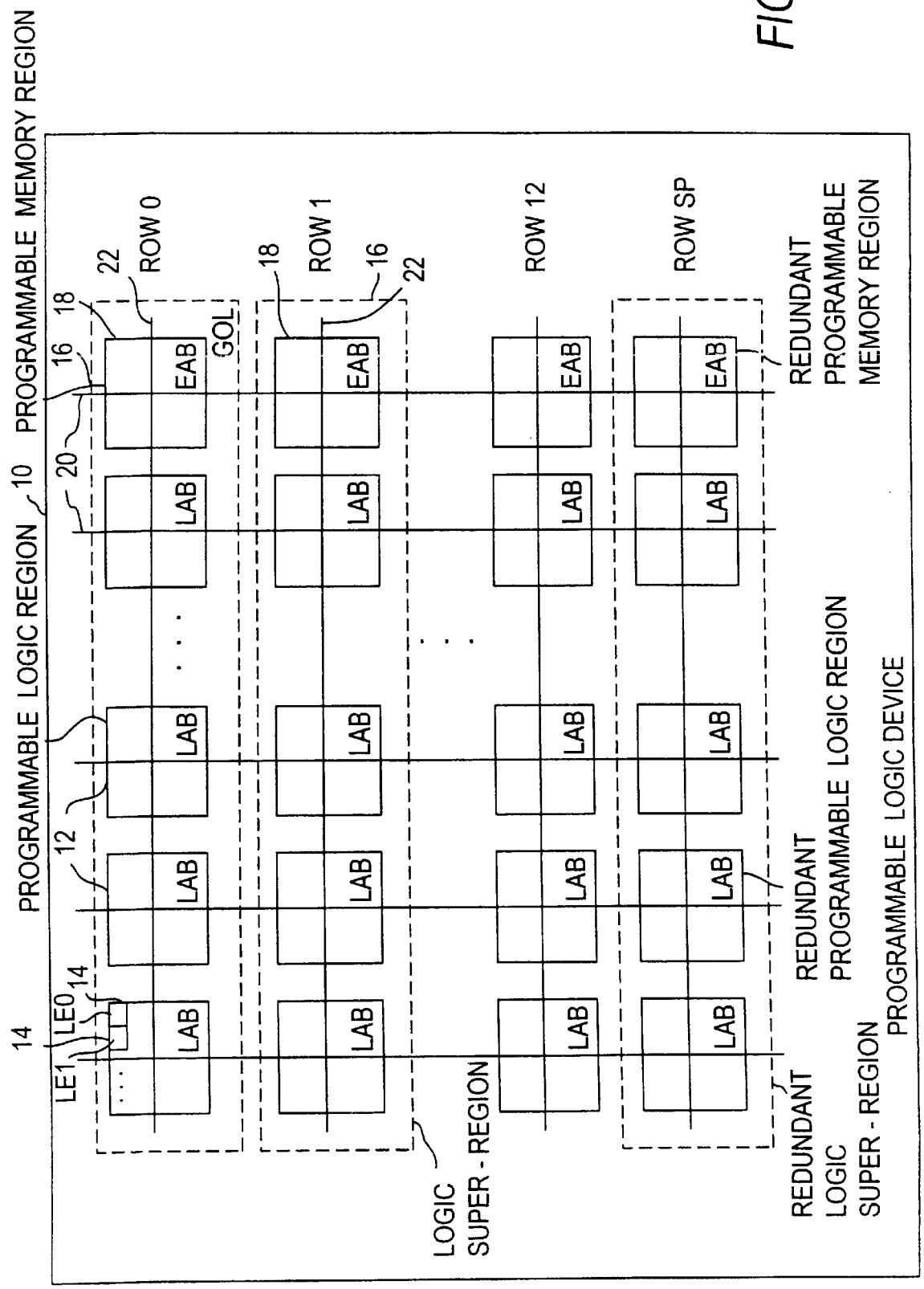
FIG. 1 is a diagram of a programmable logic device in accordance with the present invention.

The present invention relates to programmable logic devices with redundant circuitry. An illustrative programmable logic device 10 in which redundancy may be provided in accordance with the present invention is shown in FIG. 1. Programmable logic device 10 has a number of programmable logic regions 12 arranged in rows and columns. Programmable logic regions 12 may be, for example, blocks of logic known as logic array blocks (LABs). Each logic region may contain a number of smaller areas of logic such as logic elements 14, each of which contains logic that is programmable by the user. For example, each logic region may contain ten logic elements. Logic elements 14 may contain register logic and may be based, for example, on product-term logic, look-up table logic, or any other suitable type of programmable logic.

Programmable logic regions 12 may be organized in the form of logic super-regions 16. Logic super-regions 16 may be, for example, groups of programmable logic regions known as groups of LABs (GOLs). Each logic super-region 16 may contain one or more programmable memory regions 18. For example, each logic super-region 16 may contain a programmable memory region known as an embedded array block (EAB). One of the logic super-regions 16 is redundant (e.g., row SP). If a defect is detected during manufacturing, the defective logic super-region 16 is bypassed and the redundant logic super-region is switched into place.

Programmable logic device 10 may contain any suitable number of logic super-regions 16. For example, programmable logic device 10 may contain 13 regular rows of programmable logic regions 12 and programmable memory regions 18 and one row that is redundant, each row being organized as a separate logic super-region 16. Such an arrangement is shown in FIG. 1. In a typical configuration, the circuitry shown in FIG. 1 may be one quadrant of a programmable logic device that contains four such sets of logic regions. For clarity, the present invention is described in connection with one such quadrant. Moreover, the present invention is described in connection with rows of logic, whereas it could just as easily have been described in connection with columns of logic. The principles of the present invention apply equally to rows and columns of logic.

Programmable logic device 10 has vertical conductors 20 associated with each column of programmable logic regions 12 and associated with the column of programmable memory regions 18. Programmable logic device 10 also has horizontal conductors 22 associated with each row of programmable logic regions 12 (and thus associated with the programmable memory region 18 associated with that row). If desired, some or all of the horizontal conductors 22 may be segmented (e.g., divided into two or more parts). For example, there may be 100 complete horizontal conductors 22 and 279 segmented horizontal conductors 22 associated with each row of logic regions. There may be, for example, 80 vertical conductors associated with each column of logic regions and the column of programmable memory region. The number of conductors associated with each row and column is merely illustrative. Any suitable number of conductors may be associated with each row and column of logic.

Figure 2:
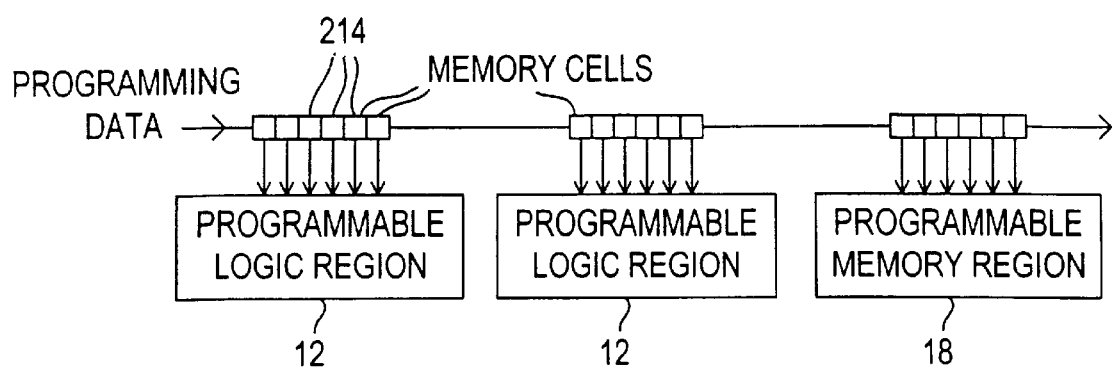
FIG. 2 is diagram of illustrative memory cell chains used for providing programming data to the logic of the programmable logic device of FIG. 1 in accordance with the present invention.

As shown in FIG. 2, each programmable logic region and programmable logic device may be programmed by a user by supplying programming data through a chain of memory cells 24 (e.g., random-access memory (RAM) cells, registers, latches, suitable portions of latches or registers, or other memory-type circuits). In operation, the outputs of the memory cells determine the states of various logic components and programmable connectors in programmable logic regions 12 and programmable memory regions 18. This allows the user to configure the programmable logic device 10 to perform desired functions. There are chains of memory cells such as the chain shown in FIG. 2 associated with each logic super-region of FIG. 1. Thus, each row made up of programmable logic regions 12 and programmable memory region 18 has associated chains of memory cells 24 through which programming data may be supplied to configure the device.

Figure 3:
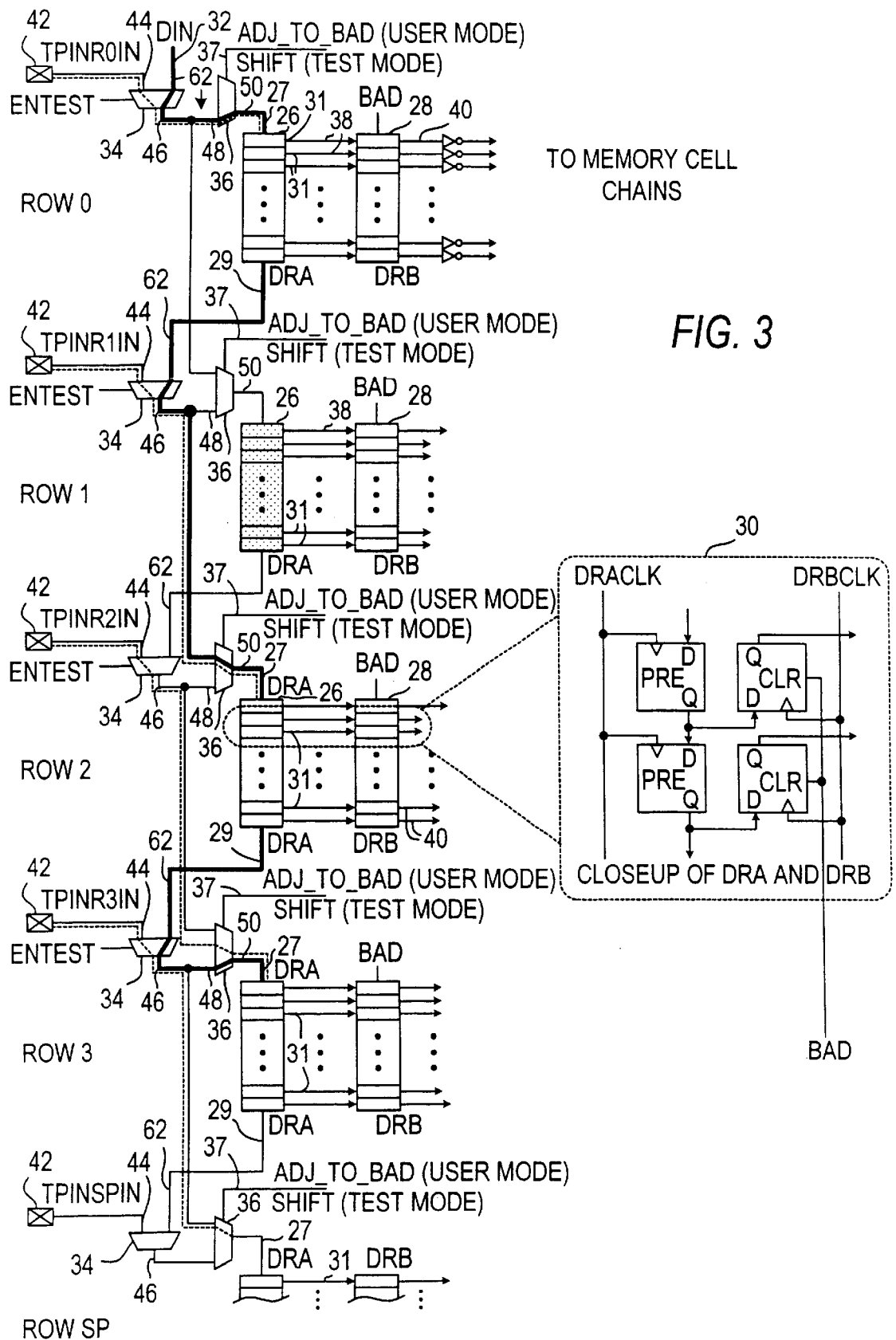
FIG. 3 is a diagram of illustrative switching circuitry and data register circuitry for use in loading programming data into the programmable logic device of FIG. 1 in accordance with the present invention.

As shown in FIG. 3, programming data may be supplied to the memory cell chains in each row using data registers 26 (DRA) and data registers 28 (DRB). Details of illustrative data registers 26 and 28 are shown in box 30. When it is desired to program programmable logic device 10, programming data is serially loaded into data registers 26 via data input 32 and multiplexers 34 and 36. Data input 32 may be connected to a suitable pin if desired for receiving the programming data from a device programmer. During serial loading, each data register 26 that is loaded receives programming data with its serial data input 27 and provides the programming data at its serial data output 29. The programming data is then shifted in parallel from data registers 26 to data registers 28 via the parallel data outputs 31 of each of the registers that are connected to lines 38. The programming data that is loaded into data registers 28 in this way is supplied to the memory cell chains associated with each row via lines 40 that are connected to the parallel data outputs of data registers 28. By repeating these serial data loading and parallel data shifting steps, programming data may be supplied to the entire programmable logic device 10.

The arrangement of FIG. 3 allows programmable logic device parts with certain defects to be repaired. A device with a defect in one of its rows may be repaired by shifting the redundant logic of row SP into place and by bypassing the row containing the defect. Two operations must be performed. First, the programming data for the device must be routed away from the defective circuitry and to the working circuitry. Second, the inputs and outputs to the portions of logic to which the programming data is provided must be reconfigured so that signal flow on the repaired part replicates that on a perfect part.

In the illustrative arrangement of FIG. 3, the programmable logic device has four rows of normal programmable logic (row 0, row 1, row 2, and row 3) and one row of redundant logic (row SP). Typically, there would be more rows of logic, but only these are shown to avoid overcomplicating the drawing. Each row has associated data registers and memory chains.

Initially, before a user may program the device, programmable logic device 10 is tested by the manufacturer by running a test program with a programmable logic device tester to determine if the device contains defects. Manufacturer testing may be performed using pins 42 to supply test data to the logic in each row of the device in parallel. Multiplexers 34 are controlled by the signal ENTEST. During manufacturer testing, ENTEST is high, which configures each multiplexer 34 to direct its parallel input 44 to its output 46. In addition, during manufacturer testing each multiplexer 36 is configured to direct its parallel input 48 to its output 50. The state of multiplexers 36 are determined by control signals applied to control inputs 37. Configuring multiplexers 34 and 36 so that parallel inputs 48 are connected to outputs 50 during manufacturer testing directs manufacturer test data to each of the rows of logic shown in FIG. 3.

Figure 4:
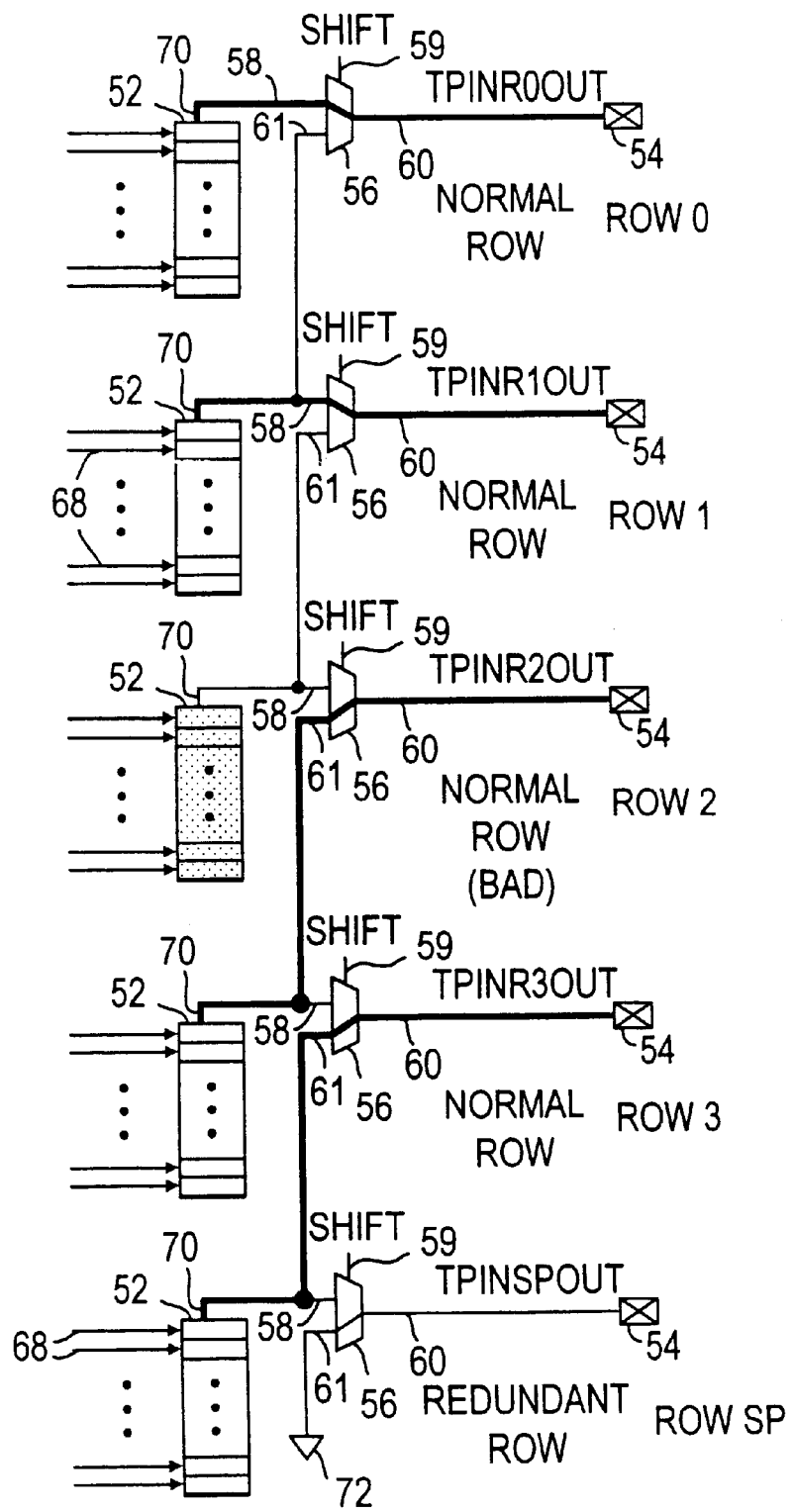
FIG. 4 is a diagram of illustrative test register circuitry for unloading data from the programmable logic device of FIG. 1 in accordance with the present invention.

If desired, the manufacturer test data from each memory cell chain may be received by registers 52 of FIG. 4 and may be shifted out to pins 54 via multiplexers 56, each of which may be configured to direct its unshifted input 58 to its output 60 by an appropriate control signal applied to its control input 59. The response of the programmable logic device to various test vectors supplied as part of the manufacturer test data may be analyzed by the programmable logic device tester to determine whether the programmable logic device contains a repairable defect.

If programmable logic device 10 contains an unrepairable defect, the part is discarded. If programmable logic device 10 contains no defects, the part is perfect and may be sold to a user. If programmable logic device 10 contains a repairable defect, the device may be reconfigured to shift the redundant circuitry of row SP into use.

If, for example, it is determined that row 1 of FIG. 3 contains a defect, programming data intended for row 1 is shifted past row 1 into row 2 during device programming. Similarly, the programming data originally intended for row 2 is shifted into row 3 and the programming data originally intended for row 3 is shifted into row SP (the redundant row). The programming data is supplied to the non-defective rows of logic via the memory cell chains associated with the non-defective rows. The defective row (row 1) does not receive any programming data.

The manufacturer may reconfigure devices that contain repairable defects using, for example, fuse logic that is configured by a laser. This type of configurable logic is merely illustrative. Any suitable logic that may be configured permanently or semi-permanently by the manufacturer upon detecting that the programmable logic device must be reconfigured to bypass a defective row of logic may be used. For example, such logic may include logic based on anti-fuses (another type of fuse logic), erasable programmable read-only memory (EPROM) transistors, etc.

Figure 5:
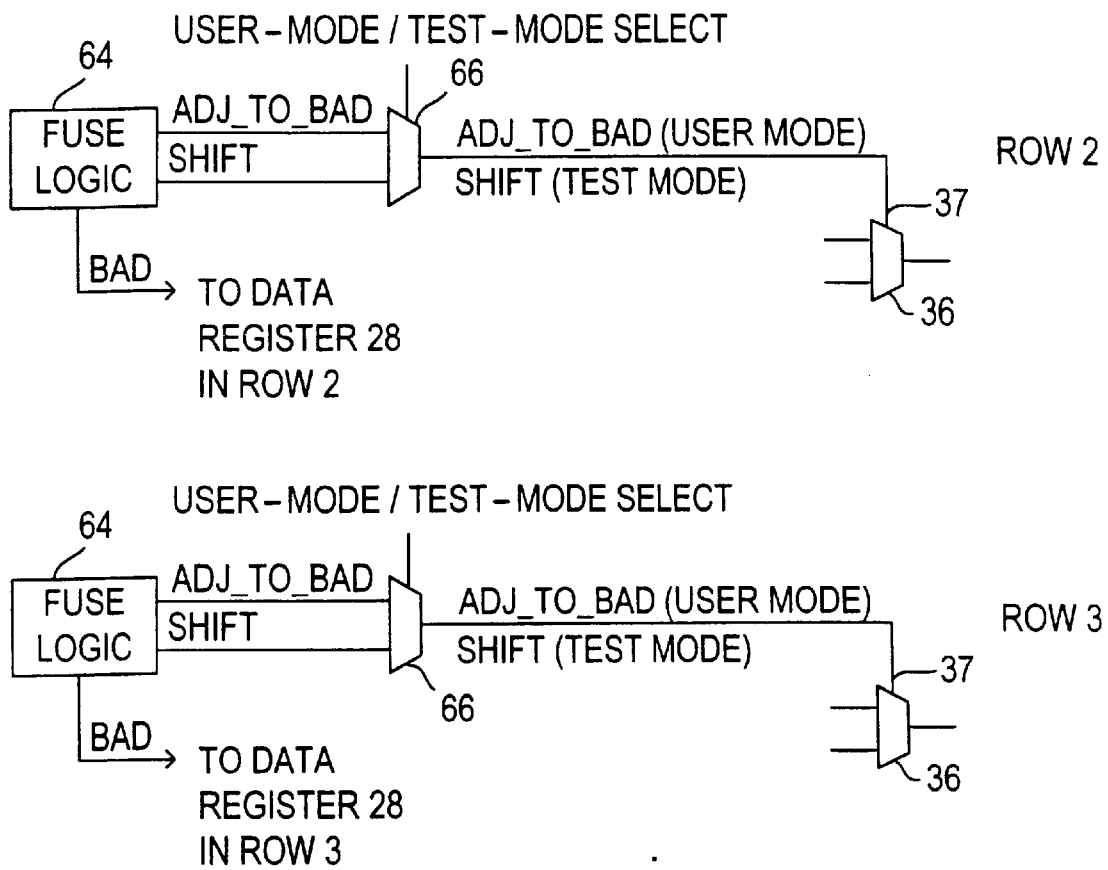
FIG. 5 is a diagram of illustrative fuse logic that may be used to control the switching circuitry of FIG. 3 when a defect is detected on the programmable logic device in accordance with the present invention.

An illustrative fuse logic arrangement is shown in FIG. 5. Fuse logic 64 is the same in each row, so only two representative rows are illustrated in FIG. 5. After the manufacturer determines which row contains the defect, the manufacturer configures fuse logic 64 in each of the rows to produce three signals. The signal BAD is high in the row containing the defect and is low in all other rows. The signal ADJ_TO_BAD is low in every row except the one immediately below or past the defective or bad row. (In the bad row, the ADJ_TO_BAD signal may actually be either high or low without consequence). The signal SHIFT is low in every row above or before the bad row and is high for the bad row and every row below or past or following the bad row. After the manufacturer has configured the fuse logic 64 in each row of logic (i.e., the fuse logic 64 for each logic super-region 16), the manufacturer may retest the device to ensure that the repair was successful. The manufacturer may then ship the product to the user.

A programmable logic device may be programmed by the user with equipment known as a programmer. During device programming by the user, programmable logic device 10 is placed in user mode by the programmer. In user mode, the programmer applies a low ENTEST signal to multiplexers 34 of FIG. 3, which configures multiplexers 34 so that their serial inputs 62 are directed to their outputs 46. In addition, the signal ADJ_TO_BAD is applied to multiplexers 36 by fuse logic 64 and by multiplexers 66 (FIG. 5). Multiplexers 66 are configured by the programmer via the user-mode/test-mode select signal, so that multiplexers 66 output the ADJ_TO_BAD signal during user mode. The ADJ_TO_BAD signal is low in every row except the one immediately past the bad row (i.e., row 1 in the example of FIG. 3). The ENTEST and ADJ_TO_BAD signals configure multiplexers 34 and 36 so that programming data supplied to the device at programming data input 32 during user mode follows the darkened path shown in FIG. 3, flowing into the data registers 26 in the good rows and the redundant row (i.e., the last or bottommost row in FIG. 3), but bypassing the data register 26 in the bad row. After the data registers 26 in the good rows and the redundant row have been serially loaded with programming data, the programming data in these rows is shifted into the corresponding data registers 28 in parallel. The signal BAD is high in the bad row, which maintains the data registers 28 in the bad row in a cleared state as shown in box 30, so that the bad row is loaded with low data, thereby inactivating as much of the circuitry in the bad row as possible. The programming data in the loaded data registers 28 is supplied to the memory cell chains via lines 40. The serial loading and parallel unloading process is repeated until all of the programming data for the entire programmable logic device 10 has been loaded into the memory cell chains. The programmable logic device 10 is thus successfully programmed as though it were free of defects. In this way, the redundant logic circuitry (i.e., redundant logic super-region 16) is shifted into place to repair the otherwise defective part.

One of the advantages of the arrangement of FIG. 3 is that it does not require the use of individual multiplexers to shift each stream of programming data as it leaves data registers 26 on one of lines 38 as was done with previously-known programmable logic devices. Rather, all the programming data for a given row may be shifted to the next row using a single set of multiplexers 34 and 36 for each row. This reduces the amount of resources that are required to implement redundancy, making the programmable logic device less complex and more economical.

Although the switching circuitry of the example of FIG. 3 uses multiplexers 34 and 36 to bypass a defective row, other suitable arrangements may be used if desired. For example, if it is not necessary to test the programmable logic device in parallel, multiplexers such as multiplexers 34 are not needed to route the parallel inputs from pins 42. In this case the switching circuitry could be based on a series of multiplexers such as multiplexers 36 each of which could receive as its input either the serial data output of a preceding data register (when the preceding row is defect-free) or the serial data output of a register that precedes the preceding data register (when the preceding row is defective).

The manufacturer may desire to retest programmable logic device 10 after device 10 has been reconfigured setting fuse logic 64 so that the redundant logic is shifted into use in place of the defective logic. This allows the manufacturer to ensure that the device is working properly. Such testing is performed with a logic programmer or tester by placing programmable logic device 10 in test mode. In test mode, signal ENTEST that is applied to multiplexers 34 is low, which configures multiplexers 34 of FIG. 3 so that their parallel inputs 44 are directed to their outputs 46. In addition, the signal SHIFT is applied to multiplexers 36 by fuse logic 64 and by multiplexers 66 (FIG. 5) that are configured by the user-mode/test-mode select signal to output the SHIFT signal during test mode. The SHIFT signal is low in every row above or before the bad row and is high for the bad row and every row following the bad row. The ENTEST and SHIFT signals configure multiplexers 34 and 36 so that test data supplied to the device in parallel at pins 42 during test mode follows the dotted paths shown in FIG. 3, flowing into the data registers 26 in the good rows and the redundant row (i.e., the last or bottommost row in FIG. 3), but bypassing the data register 26 in the bad row. (The lowermost pin 42 (TPINSPTIN) in FIG. 3 is not used during test mode, it is only used by the manufacturer during initial testing to determine whether the part contains a repairable defect.)

After the data registers 26 in the good rows and the redundant row have been serially loaded with user test data, the test data in these rows is shifted into the corresponding data registers 28 in parallel. The test data in the loaded data registers 28 is supplied to the memory cell chains in the same rows as the loaded data registers via lines 40. This process is repeated until all of the test data for the entire programmable logic device 10 has been loaded into the memory cell chains.

The test data may be unloaded from the memory cell chains using the arrangement shown in FIG. 4. Test data is loaded in parallel into test registers 52 from the memory cells chains via lines 68. Test data is unloaded serially from each loaded test register via its output 70. Although each loaded test register is itself unloaded serially, the loaded test registers as a group may be unloaded in parallel because there is a pin 54 associated with each row. Unloading data in parallel using multiple pins 54 decreases the time required to test the device.

During unloading, the SHIFT signal is applied to multiplexers 58, which directs multiplexers 58 to route test data that was loaded into the good rows and the redundant row back to the pins 54 associated with the normal (non-redundant) rows. The data path is shown by the bold lines in FIG. 4. In the example of FIG. 4, row 2 contains a defect. In rows before the bad row (i.e., row 0 and row 1), multiplexers 58 are configured to connect their unshifted inputs 58 to their outputs 60. In the bad row (row 2) and all rows past the bad row (i.e., row 3 and redundant row SP), multiplexers 58 are configured to connect their shifted inputs 61 to their outputs 60. The multiplexer input 61 associated with the redundant row may be connected to ground 72 if desired. Pin 54 in the redundant row is not used.

When the memory cells in each row were loaded with test data, the test data in the bad row and the row past the bad row was shifted to the next lower rows. For example, the data that was originally intended for row 2 was shifted to row 3 during loading. When unloading test data, the test data from the shifted rows is shifted back to the original rows (i.e., the data from row 3 is shifted back to row 2). Because the shifted test data is shifted back to the original pins 54 during unloading, the manufacturer may operate the tester without concern as to which row has been repaired. This simplifies the test procedure.

Figure 6:
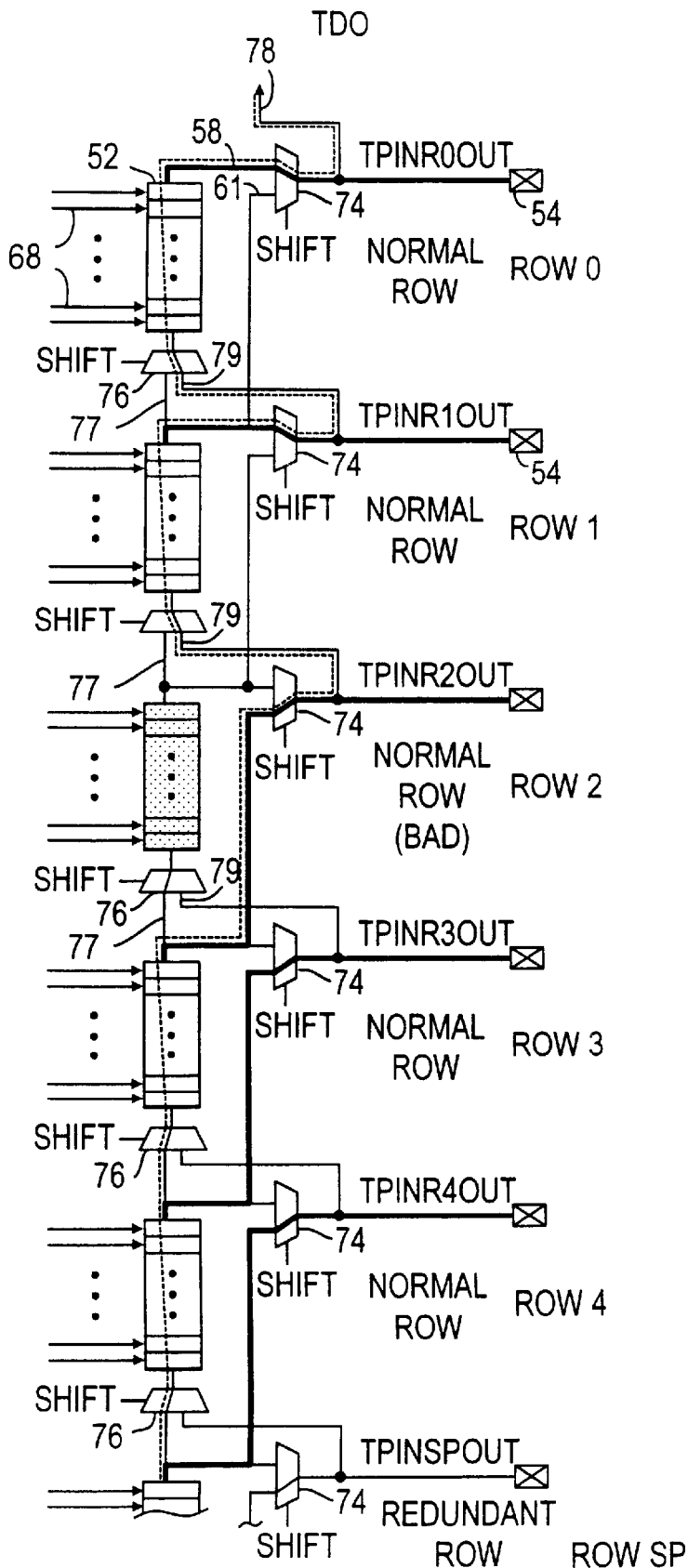
FIG. 6 is a diagram of illustrative test register circuitry for unloading data from the programmable logic device in accordance with the present invention.

If desired, test data may be unloaded using an arrangement such as shown in FIG. 6. With the FIG. 6 arrangement, output multiplexers 74 perform the same function as output multiplexers 56 of FIG. 4. Test data that was shifted away from the bad row during loading may be shifted back to the pin 54 in the bad row during unloading. Rows may be unloaded in parallel using pins 54. The data paths for such parallel unloading operations (assuming row 2 is a bad row) are shown in bold in FIG. 6.

In addition, the arrangement of FIG. 6 has additional multiplexers 76, which allow programming data to be unloaded from the device in serial through a single pin connected to test data output (TD0) 78. By serially unloading programing data in this way, the user may verify that data that the user intends to load into the memory chains is in fact being properly loaded. Programming data that is unloaded into test registers 52 is serially unloaded from test registers 52 in a single chain of test registers 52 that bypasses the test register 52 in the bad row using additional multiplexers 76. Additional multiplexers 76 have normal inputs 77 and bypass inputs 79. In the example of FIG. 6, in which row 2 is a bad row, the data path for such a serial data unloading operation is shown by a dotted line. An advantage of the arrangement of FIG. 6 is that it allows users with fairly unsophisticated test equipment (i.e., equipment that does not have the capability to monitor multiple pins in parallel) to verify that the contents of the memory cell chains are being loaded correctly using a single test pin.

If desired, an arrangement for reading out test data may be used that has only a single output pin such as output 78 of FIG. 6, rather than multiple output pins such as pins 54 of FIG. 6. Multiplexers such as multiplexers 76 may be used to chain together multiple data registers 52, but multiplexers such as multiplexers 74 are not needed. This arrangement allows the manufacturer to unload test data through a single pin, but does not allow the manufacturer the option of unloading test data through multiple pins.

Using the redundant logic super-region to repair a device with a defective logic super-region involves shifting the programming data for some of the rows of logic on the device. As a result, the programming data that was originally intended for row 4 (as an example) is instead loaded into chains of memory cells in row 5. Once the programming data that was originally intended for row 4 has been loaded into row 5, the programmable logic in row 5 is configured to perform the logic functions that were originally intended for the logic in row 4. Accordingly, it becomes important that the input data that is received by row 5 is the same as that which was originally intended to flow into row 4. Similarly, it is important that the output data that the programmable logic in row 5 drives out onto conductors 20 and 22 is provided to the same conductors to which the programmable logic in row 4 would have provided that output data.

Figure 7:
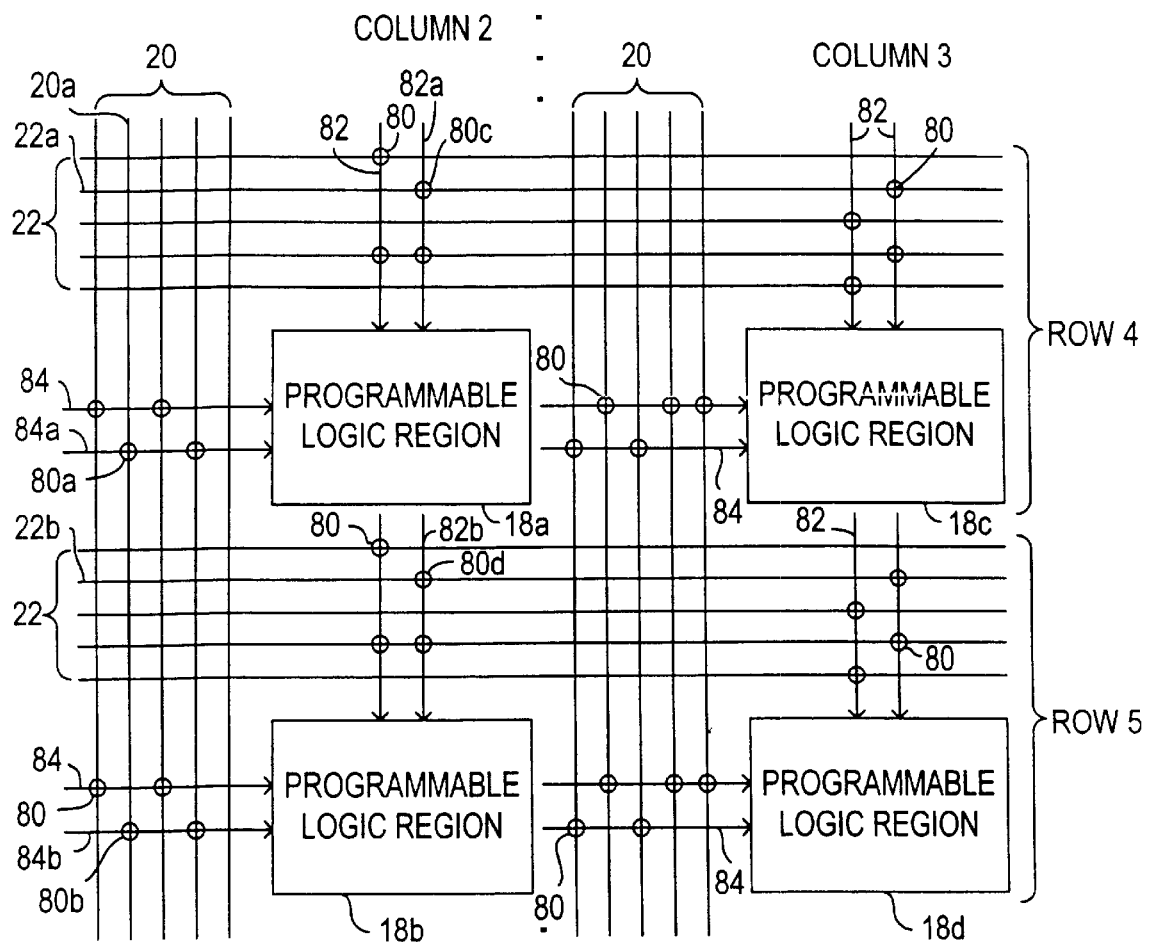
FIG. 7 is a diagram showing illustrative input patterns that may be used to connect the horizontal and vertical conductors to the programmable logic regions in accordance with the present invention.

In order to ensure that the logic in the shifted rows receives the same input signals that would have been received if that logic had been unshifted, the patterns of the inputs to each programmable logic region 18 may be identical for each row. As shown in FIG. 7, each programmable logic region 18 may receive input signals via programmable connectors 80 and horizontal input lines 82 (i.e., the input lines supplying input signals from horizontal conductors 22) and vertical input lines 84 (i.e., the input lines supplying input signals from vertical conductors 20). Programmable connectors 80 may be selectively configured by the programming data so that they make certain electrical connections between the lines and conductors that they physically connect. The horizontal and vertical input patterns associated with a logic region 18 in a particular row and column are identical to the horizontal and vertical input patterns associated with the corresponding logic regions in the same column but in different rows.

For example, the pattern of programmable connectors 80 that are associated with the vertical input lines 84 for programmable logic region 18a in row 4 and column 2 is identical to the pattern of programmable connectors 80 that are associated with the vertical input lines 84 for programmable logic region 18b in row 5 and column 2. Similarly, the pattern of programmable connectors 80 that are associated with the horizontal input lines 82 for programmable logic region 18a in row 4 and column 2 are the same as the pattern of programmable connectors 80 that are associated with the horizontal input lines 82 for programmable logic region 18b in row 5 and column 2. In addition, the pattern of programmable connectors 80 that are associated with the vertical input lines 84 for programmable logic region 18c in row 4 and column 3 is identical to the pattern of programmable connectors 80 that are associated with the vertical input lines 84 for programmable logic region 18d in row 5 and column 3. The pattern of programmable connectors 80 that are associated with the horizontal input lines 82 for programmable logic region 18c in row 4 and column 3 are the same as the pattern of programmable connectors 80 that are associated with the horizontal input lines 82 for programmable logic region 18d in row 5 and column 3.

With this arrangement, all of the input patterns of the programmable connectors 80 that are used to connect vertical input lines 84 to vertical conductors 20 in a given column of logic regions 18 are the same. In addition, the input patterns of all of the programmable connectors 80 that are used to connect horizontal input lines 82 to horizontal conductors 22 in a given column of logic regions 18 are the same.

Because the vertical input patterns (i.e., the interconnection patterns used to route signals from vertical conductors into a logic region) and the horizontal input patterns (i.e., the interconnection patterns used to route signals from the horizontal conductors into a logic region) are the same for each logic region in a column regardless of which row that logic region is in, rows of logic may be shifted without adjusting the programming data associated with the input patterns to accommodate changes in the input patterns.

For example, assume that a signal was originally intended to be routed from vertical conductor 20a into programmable logic region 18a via an electrical connection made by programmable connector 80a and vertical input line 84a in row 4. If the programming data for the logic of row 4 is shifted to row 5 because it is necessary to repair a defect on the device, programmable logic region 18b must receive the signal from vertical conductor 20a in the same way that programmable logic region 18a would have received that signal. As shown in FIG. 7, this is accomplished by routing the signal on vertical conductor 20a to programmable logic region 18b via programmable connector 80b and vertical input line 84b.

Horizontal logic may be shifted in much the same way. For example, assume that a signal was originally intended to be routed from horizontal conductor 22a into programmable logic region 18a via programmable connector 80c and horizontal input line 82a in row 4. If the programming data for the logic of column 4 is shifted to column 5 because it is necessary to repair a defect on the device, programmable logic region 18b must receive the signal from horizontal conductor 22b in the same way that programmable logic region 18a would have received that signal. This is accomplished by routing the signal on horizontal conductor 22b to programmable logic region 18b via programmable connector 80d and horizontal input line 82b. Because the horizontal input patterns are the same in each column, rows may be shifted without affecting the way in which logic signals are routed over the horizontal conductors within each row. Thus, signals may be provided to the logic regions in a shifted row in the same way that those signals would have been provided in an unshifted row.

Figure 8:
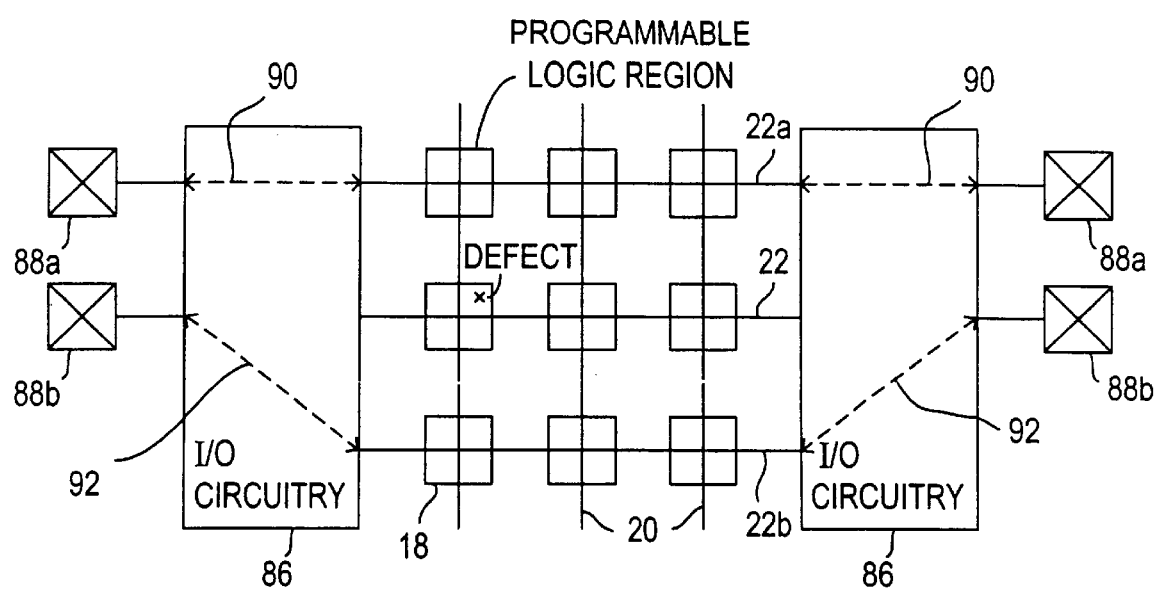
FIG. 8 is a diagram of a programable logic device showing how input/output circuitry may be used to redirect logic signals to and from a row of shifted logic in accordance with the present invention.

As shown in FIG. 8, programmable input/output circuitry 86 at the periphery of programmable logic device 10 may be used to redirect input and output signals from pins 88 to the appropriate rows of horizontal conductors 22 when there is logic shifting to accommodate a defect. In the example of FIG. 8, there is a defect in the central row. Accordingly, the logic in the bottom (redundant row) may be shifted into use in place of the defective row. This may be accomplished by redirecting the programming data that was originally intended for the central row into the bottom row using an arrangement such as shown in FIG. 3. Input and output signals for pins 88a are connected to horizontal conductors 22 in the top row via paths 90. However, in order to ensure that input and output signals at pins 88b are routed correctly after the logic for the central row is shifted to the bottom row, input/output circuitry 86 connects pins 88b to horizontal conductors 22b via paths 92.

Figure 9:
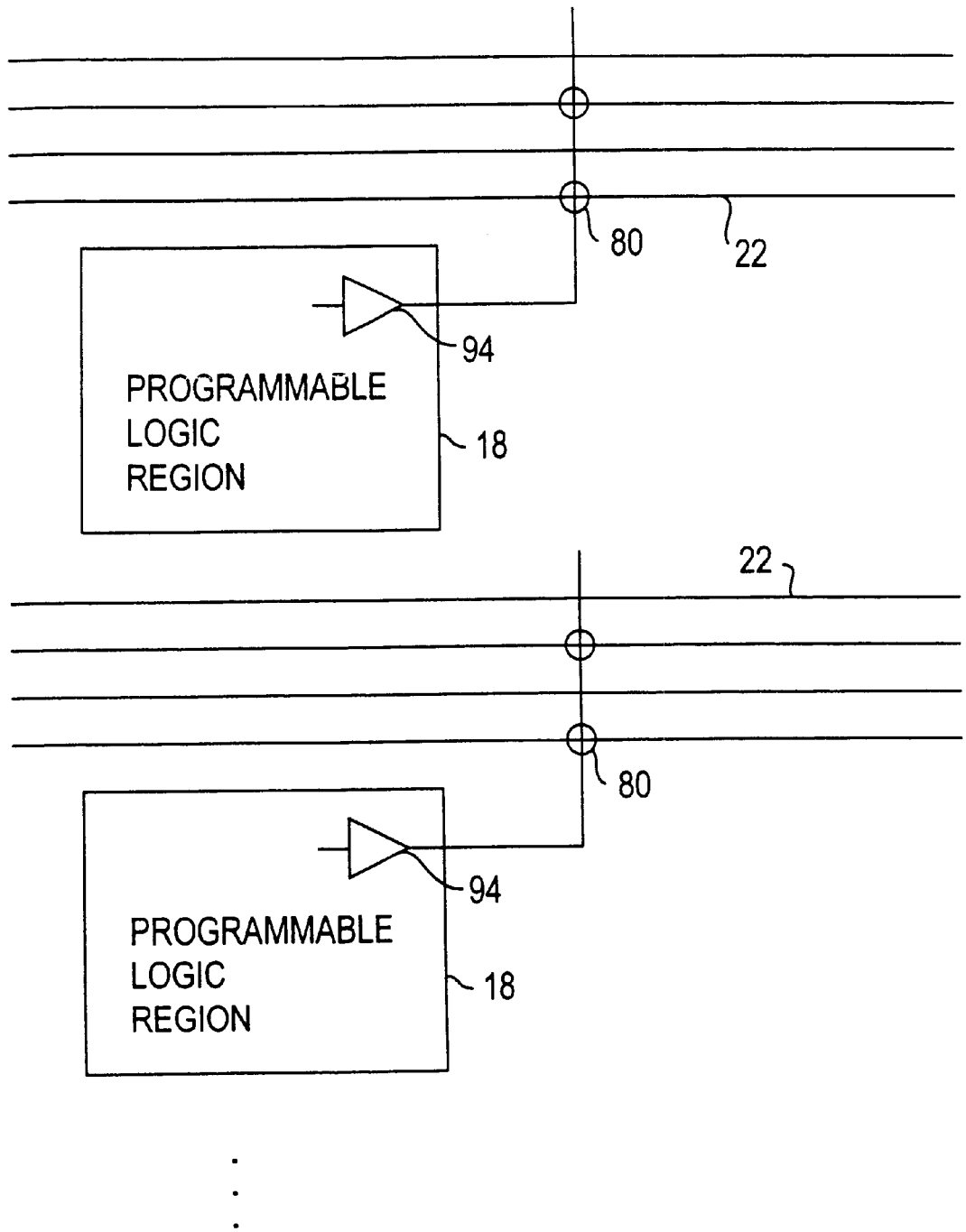
FIG. 9 is a diagram showing how the output pattern with which a programmable logic device drives the horizontal conductors may be the same in each row in a given column in accordance with the present invention.

It is also important that the output patterns used in driving output signals onto the horizontal conductors 22 and the vertical conductors 20 be able to accommodate row shifting. As shown in FIG. 9, each programmable logic region 18 may have associated horizontal output drivers 94 that drive horizontal conductors 22 via programmable logic connectors 80. In order to accommodate row shifting, the pattern in which outputs are provided to horizontal conductors 22 may be the same for all of the programmable logic regions in each column of programmable logic regions, as shown in FIG. 9. Signals that are to be routed off of the device via pins such as pins 88 of FIG. 8 may be directed to the appropriate pin 88 from horizontal conductors 22 using input/output circuitry 86 (FIG. 8.). For example, if the logic of row 3 is shifted to row 4 to repair a defect, the signals that would normally have been driven onto the horizontal conductors 22 for row 3 are driven onto the horizontal conductors 22 for row 4 and signals to and from the horizontal conductors for row 4 are connected to the pin that is associated with row 3 via input/output circuitry such as input/output circuitry 86 of FIG. 8.

In the illustrative example of FIGS. 7, 8, and 9, the horizontal input patterns in a given column are the same in each row, the horizontal output patterns in a given column are the same in each row, and the vertical input patterns in a given column are the same in each row. These arrangements allow rows to be shifted when needed to repair a defective row. The vertical output patterns associated with each programmable logic region must also be arranged so that rows may be shifted. However, in order to ensure that there is sufficient flexibility to route signals throughout the device, it is desirable not to make all four patterns (vertical input, vertical output, horizontal input, and horizontal output) in a given column the same for each row, as this would reduce the options available for routing. Accordingly, at least one of these four patterns in a given column (and in this example, the vertical output pattern) is preferably configured at least slightly differently for each row, while still accommodating row shifting.

Figure 10:
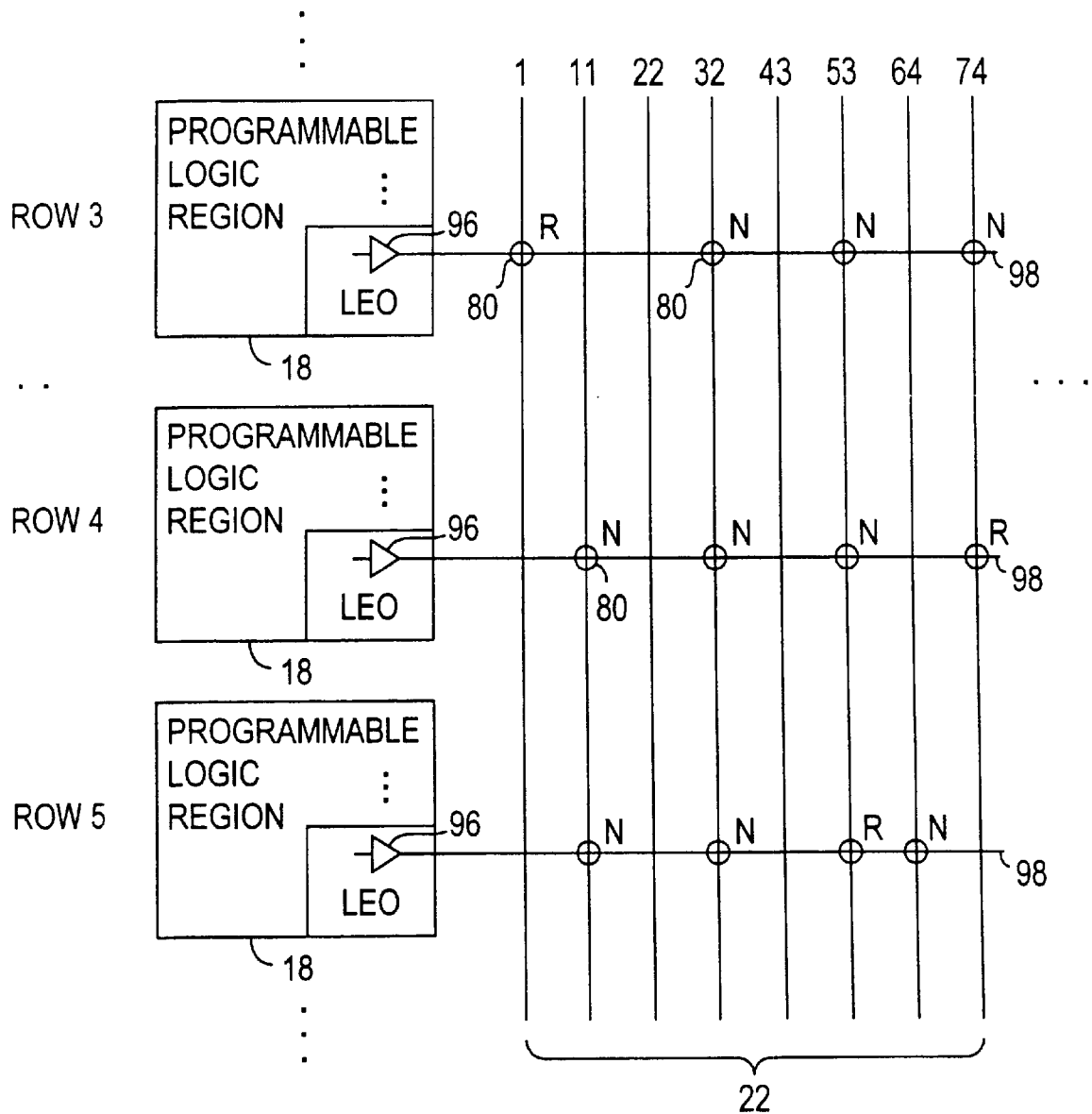
FIG. 10 is a diagram showing an illustrative pattern for interconnecting the vertical output drivers associated with various programable logic regions and the vertical conductors in accordance with the present invention.

One suitable configuration for the vertical output pattern associated with the logic regions is shown in FIG. 10. Only a single column and several representative rows of programmable logic regions 18 are shown in FIG. 10. Each programmable logic region 18 has a number of associated vertical output drivers 96 each of which may be associated with a logic element (for example, the illustrative LE0 in each region 18 of FIG. 10). Only a single vertical output driver 96 for each programmable logic region 18 is shown in FIG. 10 to avoid overcomplicating the drawing. In general, there are numerous such vertical output drivers 96 and associated vertical output lines 98 for each programmable logic region 18. There may be, for example, a vertical output driver 96 and vertical output line 98 for each of ten logic elements (LE) in the programmable logic region. Each of the programmable logic regions 18 is preferably the same and so therefore each has the same number of associated vertical output lines.

There are a number of vertical conductors 22 associated with each column of programmable logic regions. For example, there may be 80 such vertical conductors 22. Only a few of the 80 vertical conductors associated with the column of programmable logic regions 18 of FIG. 10 are shown in FIG. 10 to avoid overcomplicating the drawing. In particular, conductors 1, 11, 22, 32, 43, 53, 64, and 74 are shown.

Each driver 96 and line 98 is physically connected to four different vertical conductors 22 by a programmable connector 80. During user mode the user may load programming data into the device that selectively configures programmable connectors 80 and thereby makes certain desired electrical connections between lines 98 and conductors 22. For each line 98, three of the programmable connectors 80 are labeled "N" and one of the programmable connectors 80 is labeled "R." The programmable connector labeled R is a redundant connector and is never used unless the device is being repaired and redundant circuitry must be shifted into use. The other three programmable connectors for each line 98, which are labeled N, are normal connectors and, in the absence of any data shifting for redundancy, each of these connectors may be used to electrically connect that line to a respective vertical conductor 22.

A table showing an illustrative pattern of normal and redundant programmable connectors for a given line (e.g., the line connected to the LE0 driver) that is in the same corresponding location in each programmable logic region in a column of programmable logic regions is shown in FIG. 11. The pattern of programmable logic connectors that are used for each programmable logic region may include similar programmable connectors for each of the other vertical output lines associated with that programmable logic region (e.g., the lines connected to the drivers for LE1–LE9) . A shown in FIG. 11, the pattern of normal programmable connectors for the LE0 line in each row partially overlaps with the pattern of normal programmable connectors for the same line in adjacent rows, except that the pattern of programmable connectors for the LE0 line in the normal row (row 12) completely overlaps with that in the redundant row. This is because the location of the redundant and normal programmable connectors in the redundant row is not critical. For example, the redundant programmable connector for the LE0 line in row SP may be connected to vertical conductor No. 1 if desired, rather than vertical conductor No. 74 as shown. It is only important that there be some programmable connectors for line LE0 in row SP (the redundant row) that are available to be programmed to make the connections normally made by the programmable connectors in the corresponding line (line LE0) in row 12 in the event that the programming data from row 12 must be shifted to row SP to accommodate a repair.

Figure 12:
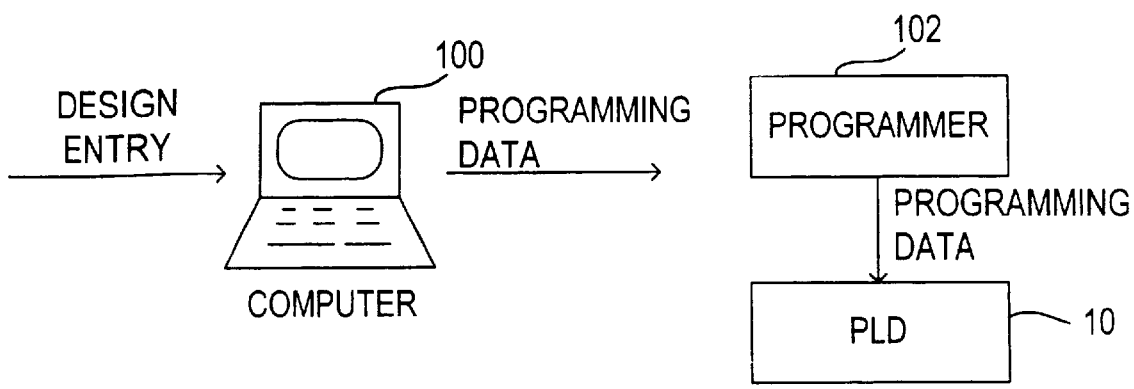
FIG. 12 is a diagram of equipment used in programming the programmable logic device of FIG. 1 in accordance with the present invention.

The configuration of the redundant connector and the three normal connectors in each row of FIG. 10 (FIG. 11) (i.e., which connectors make electrical connections) is determined by programming data provided to that row. As shown in FIG. 12, the process of programming a programmable logic device involves entering a desired logic design into a computer 100. The computer 100 provides the programming data to a device programmer 102 that provides the programming data to the programmable logic device 10 and thereby programs the programmable logic device.

Figure 13:
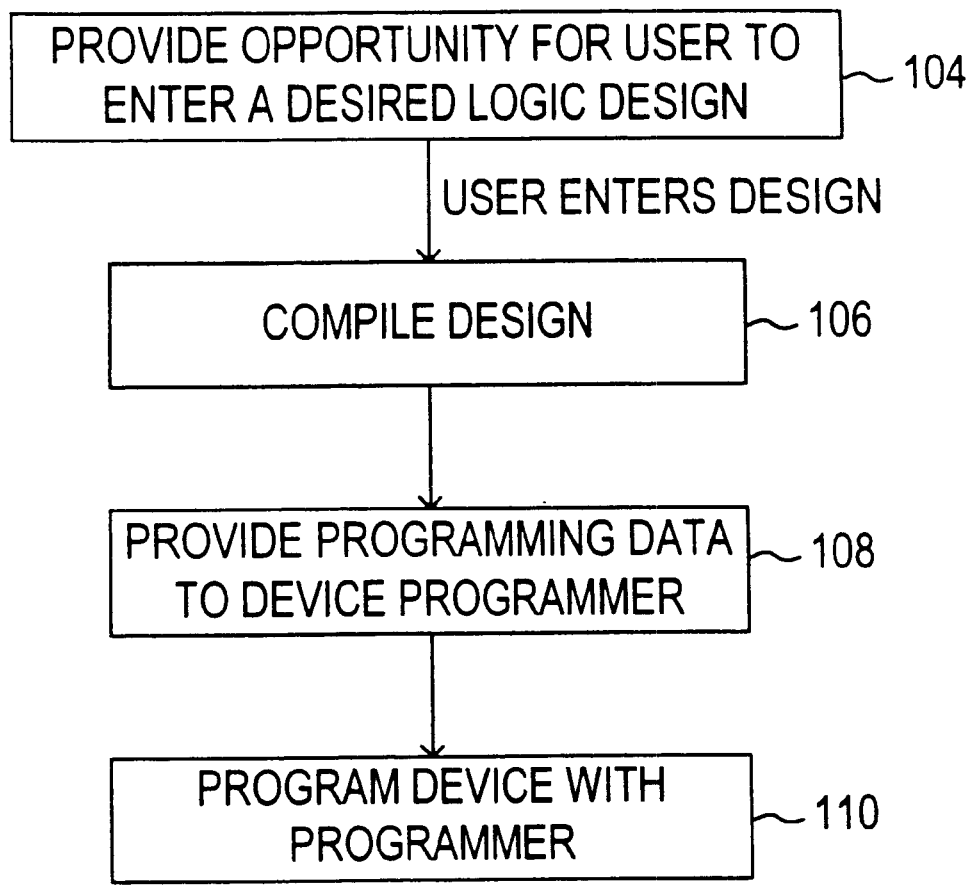
FIG. 13 is a diagram of steps involved in programming the programmable logic device in accordance with the present invention.

Steps involved in programming a programmable logic device are shown in FIG. 13. At step 104, computer 100 (FIG. 11) provides the user with an opportunity to enter a logic design. Following step 104, after the user has entered the logic design, computer 100 (FIG. 11) compiles the logic design at step 106 and generates programming data for the design. The programming data is provided to device programmer 102 by computer 100 at step 108. At step 110, device programmer 102 programs programmable logic device 10 (FIG. 1).

When repairing a defective row of logic on the programmable logic device, some of the programming data that was originally intended for one row is shifted into adjacent rows. By preconfiguring the programming data properly and by using the vertical driver output connection pattern of FIG. 10, programming data that is loaded into an unshifted row will configure the normal connectors to make certain electrical connections (using normal data) and will inactivate the redundant connectors so that these connectors do not make any electrical connections (using null data).

In addition, program data that is shifted into a row because the device is being repaired will automatically use the redundant connectors in that row (using normal data) and will automatically inactivate one of the normal connectors (using null data). The connectors associated with the drivers in a each row partially overlap with the connectors associated with the drivers in the next row. The normal connector that is inactivated in the shifted row is the normal connector that does not overlap with any of the connectors in the previous row. The redundant connector that is automatically activated in the shifted row is a connector that is shared with the previous row.

This arrangement allows the vertical driver output patterns to be different from row to row, which improves routing flexibility on the device. The overlap between the connectors on corresponding output lines used in adjacent rows ensures that the connections made between output drivers 96 and the vertical conductors 22 will be the same even when redundant logic is shifted into place to repair a defect.

For example, if rows 3, 4, and 5 of FIG. 10 are defect-free, the programming data provided to row 3 will be preconfigured (by computer 100 and programmer 102 of FIG. 12) to contain three normal bits of programming data (for the normal programmable connectors 80 associated with the three conductors on the right-hand side of FIG. 10—conductor No. 32, conductor No. 53, and conductor No. 74 and one bit of null programming data (for the redundant programmable connector 80 associated with the leftmost conductor—conductor No. 1). The normal programming data configures the normal connectors as closed (or active) or open (or inactive) as desired. Connectors that are closed form electrical connections between the line 98 and the conductor 22 to which that connector is connected. The null bit inactivates the redundant programmable connector and prevents the driver in row 3 from driving conductor No. 1. The programming data provided to rows 4 and 5 is also preconfigured to program and thereby configure the normal connectors and to inactivate the redundant connector.

If, on the other hand, row 3 contains a defect, the circuitry of FIG. 3 is used to shift the programming data that was originally intended for row 3 into row 4. Because the programming data is preconfigured just as it was for row 3, the first three bits of programming data (the normal bits) that were used to configure the normal connectors in row 3 are used to configure the redundant connector and the two rightmost normal connectors in row 4. The leftmost normal connector in row 4 receives the null bit that was previously used to inactivate the redundant connector in row 3. This null bit inactivates the normal connector in row 4 that would otherwise have been available to make an electrical connection between the driver in row 4 and conductor No. 11. The data originally intended for row 4 is likewise shifted into row 5.

With this arrangement, the process of preconfiguring the data automatically configures the connectors that are physically connected to the same vertical conductors 22 in the original row and the shifted row when data must be shifted to repair the device. Because the overlap between the connection patterns is not complete between adjacent rows, there is variation in the row-to-row pattern used to drive signals onto the vertical conductors 22. This is important because it provides flexibility in routing signals through the interconnects on the device. A pattern that was the same for each driver would not be as flexible or would require an excessive number of programmable connections for each driver (i.e., by fully populating the array formed by the intersection of lines 98 and conductors 22 with programmable connectors).

Figure 14:
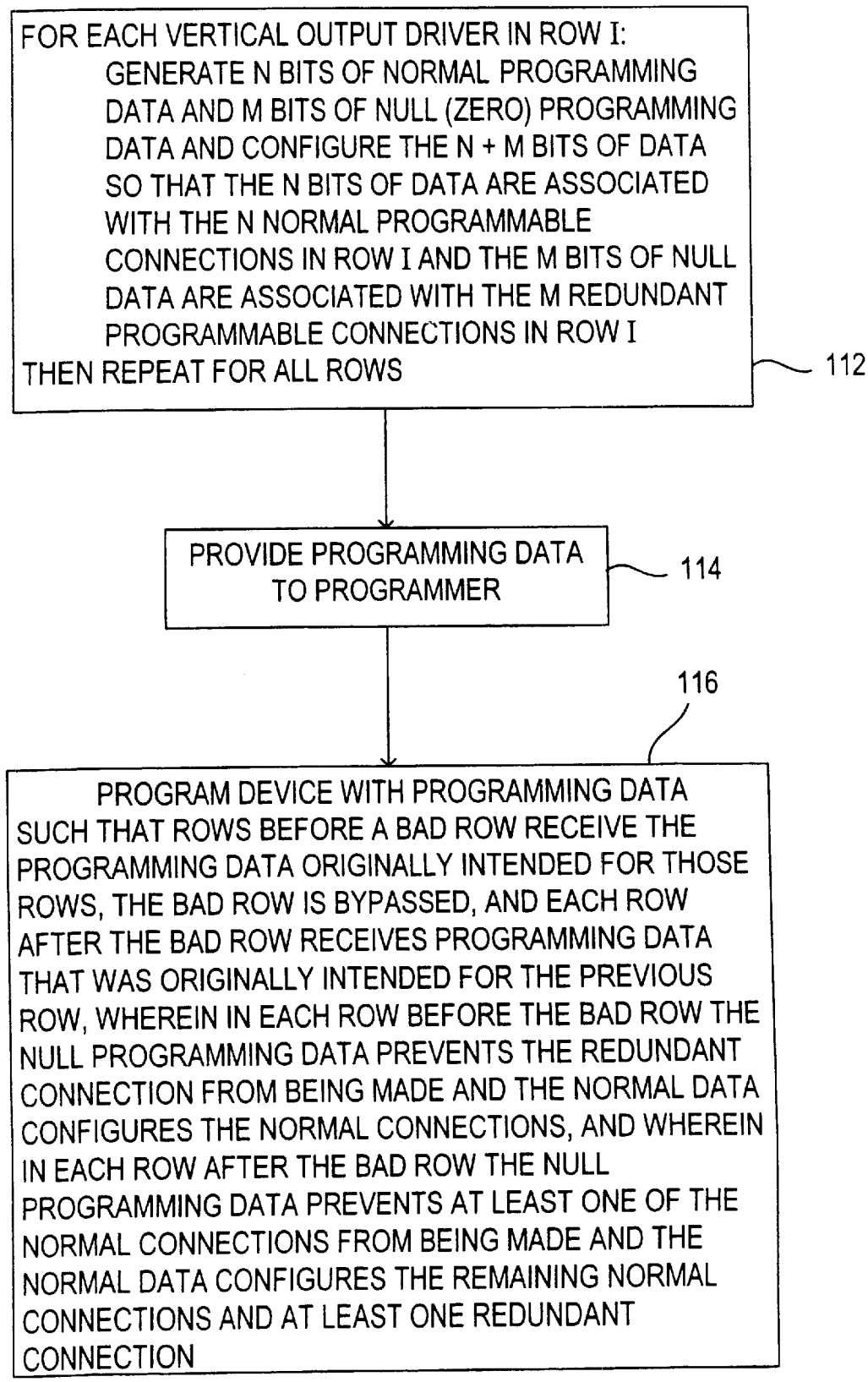
FIG. 14 is a diagram of steps involved in generating and configuring programming data and programming the programmable logic device with that programming data in accordance with the present invention.

FIG. 14 shows steps involved in preconfiguring the programming data for use with an output pattern such as shown in FIG. 10 and programming the programmable logic device using an arrangement such as shown in FIG. 12. At step 112, computer 100 of FIG. 12 uses design entry and compilation software to generate programming data for each row. In each column, the programming data that is generated for each row includes N bits of normal programming data and M bits of null (or zero) programming data. The normal programming data is for configuring the normal programmable connector (s) (labeled N in FIG. 10) between the vertical output line 98 of that row and certain vertical conductors 22. The null data is for inactivating the redundant programmable connector(s) (labeled R in FIG. 10) in that row. After this is repeated for each row of logic and for all columns, the preconfigured programming data is provided to programmable logic device programmer 102 of FIG. 1 at step 114.

At step 116, programmable logic device programmer 102 is used to program a programmable logic device 10. During programming, the programming data is loaded into the rows of programmable logic via memory cell chains such as the chain of memory cells 24 in FIG. 2.

If device 10 contains no defects, programming data is loaded straight into each row of programmable logic. The normal programming data in each row configures the normal programmable connectors 80 in the output pattern between the outputs of the programmable logic regions 18 and vertical conductors 22. The programmable connectors 80 that are configured in this way may then be used to route outputs from associated programmable logic 18 to desired vertical conductors 22. The redundant data in each row prevents the redundant programmable connectors 80 from making electrical connections to their associated vertical conductors 22 during use of the programmable logic device. Thus, no data signals are routed to a vertical conductor 22 associated with a redundant programmable connector 80.

If device 10 contains a defect, the defective row is bypassed (e.g., using multiplexers such as multiplexers 34 and 36 of FIG. 3). In the rows before the defective row, normal and redundant programming data are loaded into the memory chains as though there were no defect. Null data (zeros) are loaded in the defective row (e.g., by using a register clear function in the data register 28 of the defective row as shown in FIG. 3). In each row following the defective row, some of the normal programming data is used to program normal programmable connectors 80 (labeled N in FIG. 10). The normal programming data in each row is also used to program at least one redundant programmable connector 80 (labeled R in FIG. 10). The vertical conductor 22 to which the redundant programmable connector 80 in a given row following the defective row is connected is the same vertical conductor 22 to which one of the normal programmable connectors 80 in the previous row is connected. The redundant programmable connector 80 for a particular output line in the given row is thus able to be configured by its programming data to make the same connection that would have been made by the normal programmable connector 80 for the corresponding output line in the previous row.

Thus, with the output patterns of FIG. 10, there is only a partial overlap between the particular vertical conductors 22 to which the normal programmable connectors 80 in one row are connected and the particular vertical conductors 22 to which the normal programmable vertical conductors 22 in the next row are connected. There is, however, at least one redundant connector 80 in each row that is used when redundant circuitry is switched into place. The redundant connector 80 in each row is connected to the same vertical conductor 22 to which there would otherwise have been no normal programmable connector 80 connected in that row. This ensures that when the redundant programmable connectors 80 are used in place of some of the normal programmable connectors 80, there is a complete overlap between all of the normal programmable connectors 80 for each line in one row and some of the normal programmable connectors 80 and the redundant programmable connector 80 for each of the corresponding lines in the next row.

Regardless of whether or not device 10 contains a defect that is repaired, the programmable connectors 80 that are used for a given output line are connected to a different set of vertical conductors 22 in each row, so that interconnection pathways are not blocked as they might be if the pattern of output connections was the same in each row.

If desired, different arrangements may be used for interconnecting programmable logic regions such as programmable logic regions 18 and interconnection conductors such as horizontal conductors 20 and vertical conductors 22. For example, the partially overlapping patterns of programmable connectors that have been described for making output connections to vertical conductors could also be used for making output connections to horizontal conductors. If desired, such an arrangement could be used for making input connections from vertical conductors or from horizontal conductors. More than one set of connections (horizontal input, vertical input, horizontal output, or vertical output) may use the partially overlapping pattern if desired. In general, however, sufficient interconnection flexibility may be provided by using partially overlapping patterns for only one of these four sets of connections.

The programmable connectors 80 may be formed using a number of suitable techniques. For example, each programmable connector 80 may be a transistor controlled by a function control element (e.g., a random-access memory (RAM) cell that is one of the memory cells in the chain of memory cells shown in FIG. 2. If desired, some of the programmable connectors 80 may be replaced by fixed connectors, provided that suitable switching options are made available elsewhere on the device to retain sufficient flexibility in routing signals with the interconnection resources on the device.

The programmable connections made between various components and used in configuring programmable logic circuits in the programmable logic devices of the present invention can be implemented in any of a wide variety of ways. For example, each programmable connector can be a relatively simple programmable connector such as a switch or a plurality of switches (e.g., a multiplexer) for connecting any one of several inputs to an output. Each such connection may be configured using a memory cell such as a random-access memory cell. Alternatively, programmable connectors can be somewhat more complex elements which are capable of performing logic (e.g., by logically combining several of their inputs) as well as making connections. For example, each programmable connector can use product-term logic, implementing functions such as AND, NAND, OR, or NOR. Examples of components suitable for implementing programmable connectors are erasable programmable read-only memories (EPROMs), electrically-erasable programmable read-only memories (EEPROMs ), pass transistors, transmission gates, antifuses, laser fuses, metal optional links, etc. These programmable components may be controlled by various programmable function control elements or memory cells, which store the configuration data used to control the programmable components. Examples of suitable function control elements include static random-access memory (SRAM) cells, dynamic random-access memory (DRAM) cells, first-in first-out cells, EPROMs, EEPROMs, function control registers (e.g., as in Wahlstrom U.S. Pat. No. 3,473,160), ferro-electric memories, fuses, antifuses, or the like. From the various examples mentioned above it will be seen that this invention is applicable both to one-time-only programmable and reprogrammable devices.

If desired, the redundancy schemes of the present invention may be used in quadrants or other subsections of a programmable logic device by providing a redundant logic super-region or partially redundant logic super-region in each subsection of the device.

Although the present invention has been described in the context of a programmable logic device having a row-based redundancy scheme, the invention is equally applicable to programmable logic devices using column-based redundancy schemes. Because the terminology of rows and columns is relative to the orientation of the device, one may interchange the words row and column by merely rotating a device by 90 degrees. For clarity, the present invention is described and claimed in terms of row-based arrangements, but the present description and claims apply equally to column-based arrangements.

Figure 15:
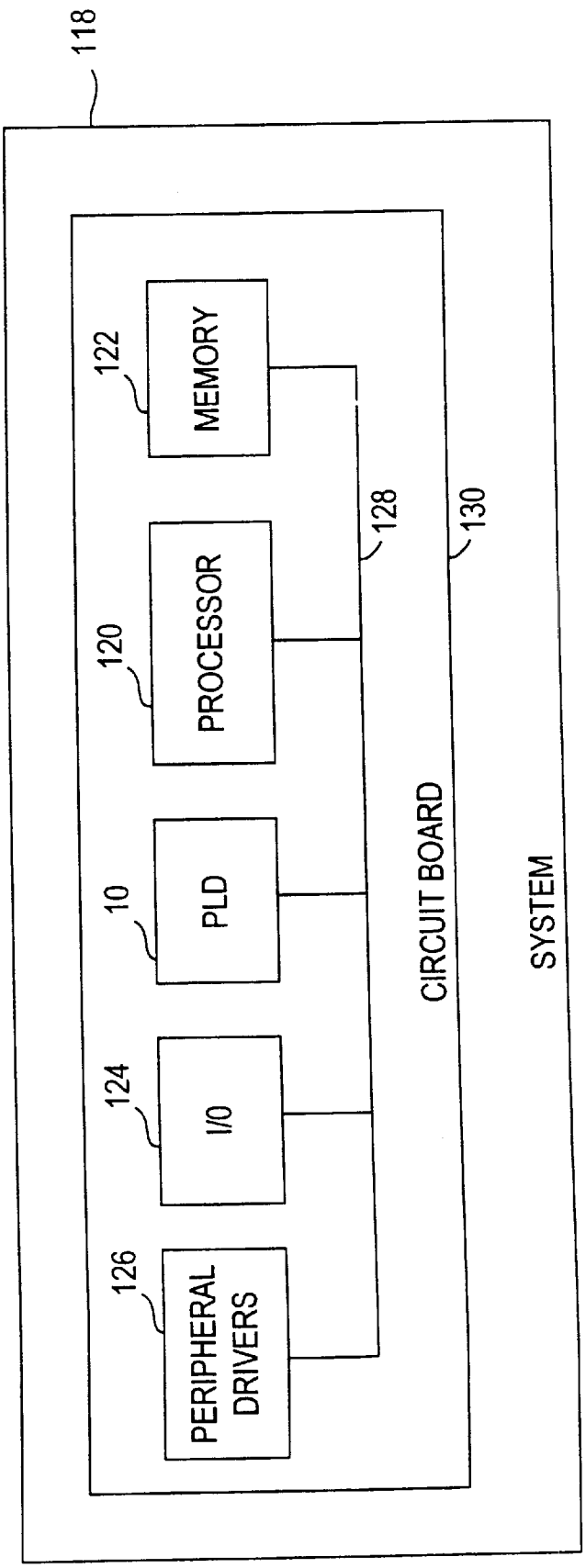
FIG. 15 is a diagram of a system including the programmable logic device of FIG. 1 in accordance with the present invention.

The foregoing arrangements are typically used in programmable logic devices that are made part of larger systems. FIG. 15 shows a programmable logic device 10 containing the redundant circuitry of the present invention in use in a digital data processing system 118. Data processing system 118 may include one or more of the following components: a processor 120, memory 122, I/O circuitry 124, and peripheral drivers 126. These components may be coupled together by a system bus 128 and may populate a circuit board 130 that is contained in system 118.

System 118 may be used in a wide variety of applications, such as computer networking, data networking, instrumentation, video processing, digital signal processing, or any other application where the advantage of using programmable logic is desirable. Programmable logic device 10 may be used to perform a variety of different logic functions. For example, programmable logic device 10 may be configured as a processor or controller that works in cooperation with processor 120. Programmable logic device 10 may also be used as an arbiter for arbitrating access to a shared resource in system 118. In yet another example, programmable logic device 10 may be configured as an interface between processor 120 and one of the other components in system 118.

The foregoing is merely illustrative of the principles of this invention and various modifications can be made by those skilled in the art without departing from the scope and spirit of the invention.

What is claimed is:

1. A programmable logic device that is repairable to provide rows and columns of programmable logic regions for programming by users, comprising:

a plurality of programmable logic regions arranged in rows, columns, and at least one additional redundant row;

a plurality of data register circuits that are each associated with one of the rows and are each for providing programming data to the row that is associated with that data register circuit for programming that row; and switching circuitry that is configurable to provide programming data to the plurality of data register circuits except to at least one of the register circuits that is associated with at least one of the rows that has been determined to be defective.

2. The device of claim 1 further comprising connection circuitry that routes input and output signals to appropriate rows and columns of the programmable logic regions when the redundant row is being used.

3. The device of claim 1 wherein said switching circuitry is permanently configurable.

4. The device of claim 1 further comprising an output that is tested to test the programmable logic regions when the regions have been loaded with programming data so as to find a defective one of the n rows.

5. The device of claim 4 wherein the output comprises an output pin for testing output data from each row serially to find the defective one of the rows.

6. The device of claim 1 wherein the data register circuits are configured to be in a serial chain with the chain having a data input connected to one end of the chain for serially loading programming data into the data register circuits and each data register circuit having parallel output connections for programming the row of programable logic regions that is associated with that register with the programming data.

7. A programmable logic device that is repairable to provide rows and columns of programmable logic regions to users for programming, comprising:

a plurality of programmable logic regions arranged in rows, columns, and at least an additional redundant row;

data registers that are configured in a serial chain with the chain having a data input connected to one end of the chain for serially loading programming data into the data registers, each register being associated with one of the rows of programmable logic regions and having parallel output connections for programming that row of programable logic regions with the programming data;

an output that is tested to find at least one of the rows that is defective;

switching circuitry that is configurable to shift programming data past the data register associated with the defective row when loading the programming data in the chain of data registers, so that the programming data is loaded into the rows including the redundant row and excluding the defective row; and connection circuitry that routes input and output signals to appropriate rows and columns of the programmable logic regions when the redundant row is being used.

8. The device of claim 7 wherein said switching circuitry is permanently configurable.

9. The device of claim 7 wherein:

each column has a plurality of vertical conductors associated therewith; and the connection circuitry comprises programmable connectors for each programmable logic region for connecting the programmable logic regions in each column to the vertical conductors associated with that column and the programmable connectors for each programmable logic region being in a pattern that includes some overlap with patterns for any adjacent programmable logic regions in that column.

10. The device of claim 7 wherein:

each row has a plurality of horizontal conductors associated therewith; and the connection circuitry comprises programmable connectors for each programmable logic region for connecting the programmable logic regions in each row to the horizontal conductors associated with that row and the programmable connectors for each programmable logic region being in a pattern that includes some overlap with patterns for any adjacent programmable logic regions in that row.

11. The device of claim 7 wherein the parallel output connections for each data register are for loading memory cells that are used to program the row of programmable logic regions that is associated with that data register.

12. The device of claim 11 further comprising two data registers for each row with one of the two data registers in each row being one of the data registers that is in the chain of data registers with parallel connections to the second one of the two data registers in that row that are used to load memory cells.

13. The device of claim 7 wherein the switching circuitry includes a pair of multiplexers for each row that are coupled to the chain of data registers whereby the pair of multiplexers for the defective row shifts programming data past the defective row of programmable logic regions.

14. The device of claim 7 wherein the output comprises one output for each row that is tested using the programming data to find a defective one of the rows.

15. The device of claim 7 wherein the output comprises one output connected to a pin for serially testing output data from each row to find a defective one of the rows.

* * * * *